United States Patent
Björklid et al.

[11] Patent Number: 6,040,743
[45] Date of Patent: Mar. 21, 2000

[54] VOLTAGE CONTROLLED OSCILLATOR FOR RECOVERING DATA PULSES FROM A DATA INPUT STREAM HAVING DIGITAL DATA WITH AN UNKNOWN PHASE

[75] Inventors: Anders Björklid, Hässelby; Malcolm Hardie, Järfälla, both of Sweden; Heinz Mäder, Weinfelden, Switzerland

[73] Assignee: Telefonaktiebolaget LM Ericsson, Stockholm, Sweden

[21] Appl. No.: 09/114,846

[22] Filed: Jul. 14, 1998

[30] Foreign Application Priority Data

Jul. 14, 1997 [SE] Sweden .................................. 9702691

[51] Int. Cl.[7] .............................. H03B 5/24; H03L 7/099; H03F 3/45
[52] U.S. Cl. .......................... 331/57; 331/34; 331/177 R; 327/270; 327/274; 327/280; 327/281; 330/253
[58] Field of Search ........................ 331/34, 57, 116 FE, 331/177 R; 327/280, 281, 287, 288, 270, 274; 330/253

[56] References Cited

U.S. PATENT DOCUMENTS

| 4,533,877 | 8/1985 | Rahim ..................... 330/253 |
|---|---|---|
| 4,584,695 | 4/1986 | Wong et al. ................ 375/81 |
| 4,672,639 | 6/1987 | Tanabe et al. ............... 375/118 |
| 5,245,637 | 9/1993 | Gersbach et al. ............. 375/119 |
| 5,422,529 | 6/1995 | Lee ........................ 327/536 |
| 5,504,444 | 4/1996 | Neugebauer ................. 327/108 |
| 5,523,723 | 6/1996 | Arcus et al. ............... 331/17 |
| 5,686,867 | 11/1997 | Sutardja et al. ........... 331/57 |

FOREIGN PATENT DOCUMENTS

| 0 252 539 | 1/1988 | European Pat. Off. . |
| 0 776 087 | 5/1997 | European Pat. Off. . |

*Primary Examiner*—David Mis
*Attorney, Agent, or Firm*—Burns, Doane, Swecker & Mathis, L.L.P.

[57] ABSTRACT

A voltage controlled oscillator (VCO), for use in a phase locked loop for clock multiplication, for example in recovery of data pulses from a data stream input comprising digital data with unknown phase. According to the invention, the VCO comprises a plurality of VCO stages, each stage being implemented as a differential amplifier. The amplifier load is formed of two cross-coupled gate devices and of two gate devices which are connected as diodes. The differential input is applied to a source coupled input pair as well as to two pull-down gate devices.

6 Claims, 7 Drawing Sheets

VOLTAGE CONTROLLED OSCILLATOR FOR RECOVERING DATA PULSES FROM A DATA INPUT STREAM HAVING DIGITAL DATA WITH AN UNKNOWN PHASE

This application claims priority under 35 U.S.C. §§ 119 and/or 365 to 9702691-8 filed in Sweden on Jul. 14, 1997; the entire content of which is hereby incorporated by reference.

BACKGROUND

The present invention relates to a voltage controlled oscillator for use in a phase locked loop for clock multiplication, for example in recovery of data pulses from a data stream input comprising digital data with unknown phase.

By embedding a clock signal into a transmitted data stream, a serial interface can operate at very high data rates without the timing skew problem between the clock and data signals. However, at the receiving end a clock/data recovery circuit is needed to recover the embedded clock signal from the incoming data stream and to retime the data.

Analog phase-locked loops (PLL) have traditionally been used for implementing the clock/data recovery circuit for high-speed applications. Although, in general, the analog PLL's can operate at very high frequencies, they tend to be more difficult to design than digital PLL's. For example, there is the problem of frequency drift, and analog PLL's are more sensitive to noise and to variations in processing and operation conditions.

However, there are also a few drawbacks associated with digital PLL's, for example the limitation on the operation speed and that they are generally worse than analog PLL's in terms of chip area and power consumption, and also when trying to reduce the number of pins of each chip package.

SUMMARY OF THE INVENTION

One object of this invention is therefore to provide a cost-efficient voltage controlled oscillator which is able to operate at high frequencies with low power and which makes it possible to use a low frequency input clock while having a high speed data transmission, thereby making it possible to reduce the number of chip package pins.

According to the invention, this is accomplished by providing the voltage controlled oscillator with a plurality of VCO stages, each stage being implemented as a differential amplifier, and the amplifier load being formed of two cross-coupled gate devices and of two gate devices which are connected as diodes, and wherein the differential input is applied to a source coupled input pair as well as to two pull-down gate devices.

According to another embodiment of the invention, a gate device is arranged to provide a sourcing bias current as a function of the control voltage $V_{CT}$.

A decreased gate voltage of a gate device M1 preferably increases the sourcing current which in turn increases the oscillation frequency.

Preferably, each VCO stage is provided with two level shifters for converting the differential oscillator signals to single ended clock outputs, and wherein the differential inputs which are referred to ground are applied to two NMOS devices.

Each level shifter is advantageously provided with two PMOS devices which may form a current mirror and provide pull-up to the output Q.

Preferably, the voltage controlled oscillator according to the invention is included in a clock phase aligner for a digital data communication system, comprising a phase locked loop circuit with a phase and frequency detector data transition phase detector which interacts with a state machine for processing of data.

BRIEF DESCRIPTION OF THE DRAWINGS

The invention will in the following be further described in a non-limiting way with reference to the accompanying drawings in which.

DESCRIPTION OF PREFERRED EMBODIMENTS

Figure 1:
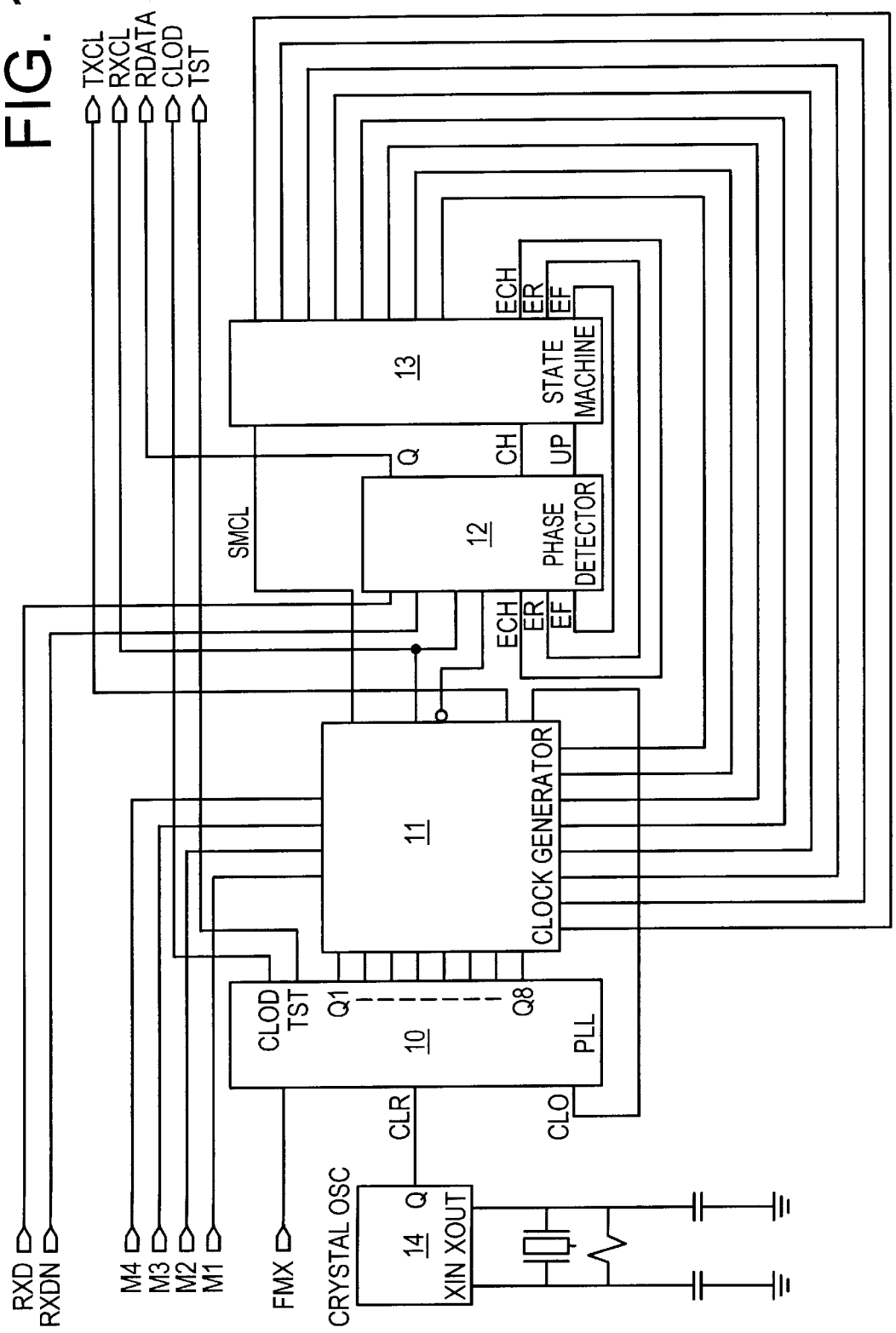
FIG. 1 is a circuit diagram showing a clock phase aligner block including a voltage controlled oscillator according to the invention.

The circuit diagram in FIG. 1 shows the structure of a clock phase aligner block which is used within a first circuit for its communication with a second circuit. The clock phase aligner block comprises a phase locked loop circuit (PLL) 10, a clock generator 11, a data transition phase detector 12, a state machine 13 and a crystal oscillator 14.

The specific blocks performing the clock phase alignment operation are the data phase detector 12 and the state machine 13 which are working interactively. The clock is generated by means of the crystal oscillator 14 and the phase locked loop 10 which provide eight 200 MHz clock signals being equally spaced in phase. The PLL is not interacting in the phase alignment operation.

Inputs to the clock phase aligner block are complementary data inputs RXD and RXDN which are provided from the LVDS input buffer. An internally generated LOCK signal will be low while the training sequence is transmitted/received to/from the second circuit. When signal LOCK is low, the clock phase aligner is treating the rising data transitions only. With LOCK being high, the Clock Phase Aligner is alternating between rising and falling edges. Alternating between the rising and the falling edges has the advantage that systematic phase errors of the RX data, e.g. due to distortion are averaged independent of the data pattern. However, this operation must be suppressed during the acquisition of the clock phase aligner since there is a possibility of getting stuck in the meta-stable phase state. The outputs of the Clock Phase Aligner are TXCL, the transmit direction clock; RXDATA which is the re-timed data input and RXCL which is the phase-aligned clock.

Figure 2:
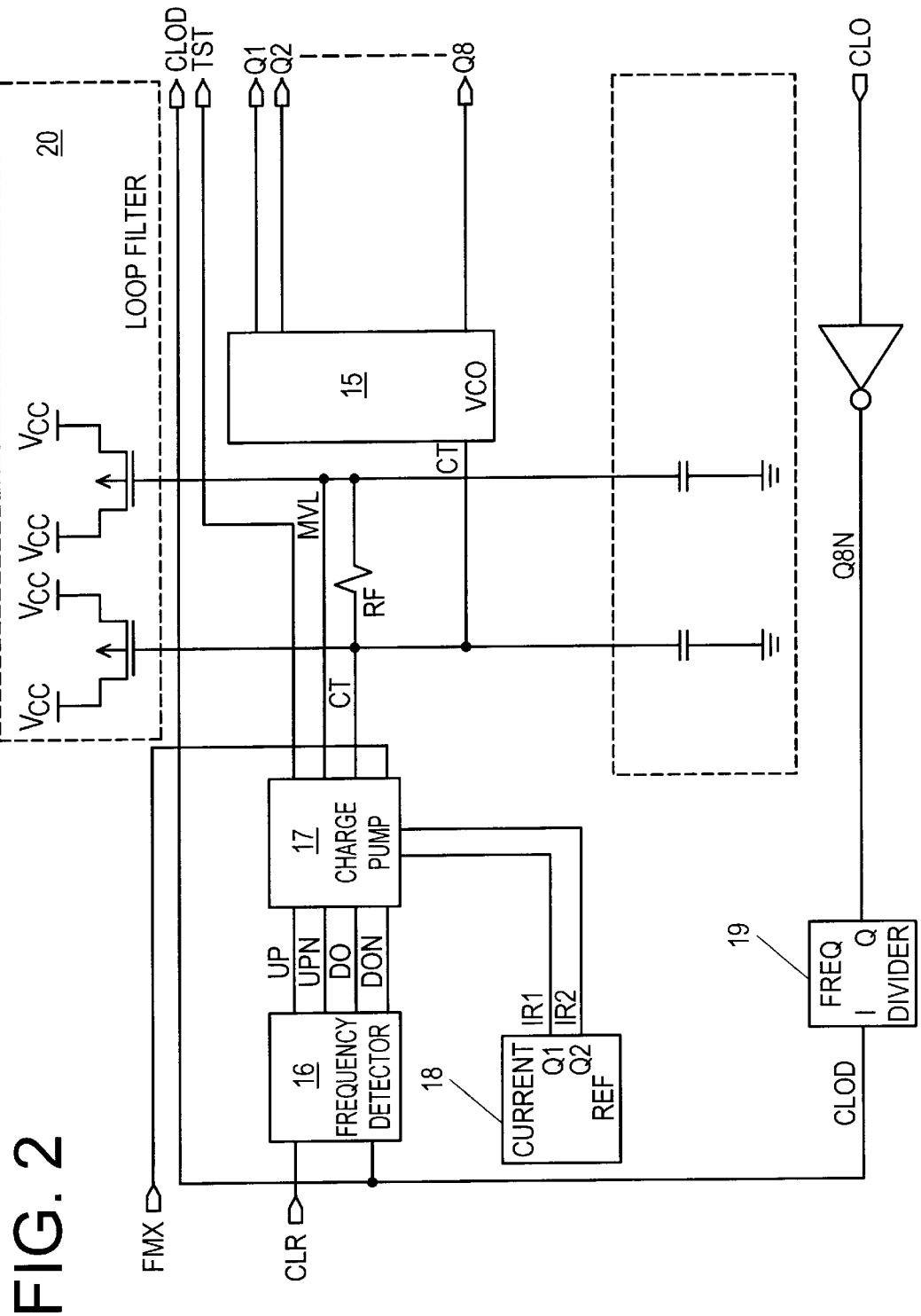
FIG. 2 is a circuit diagram showing the phase locked loop of the phase aligner block according to FIG. 1.
Figure 3:
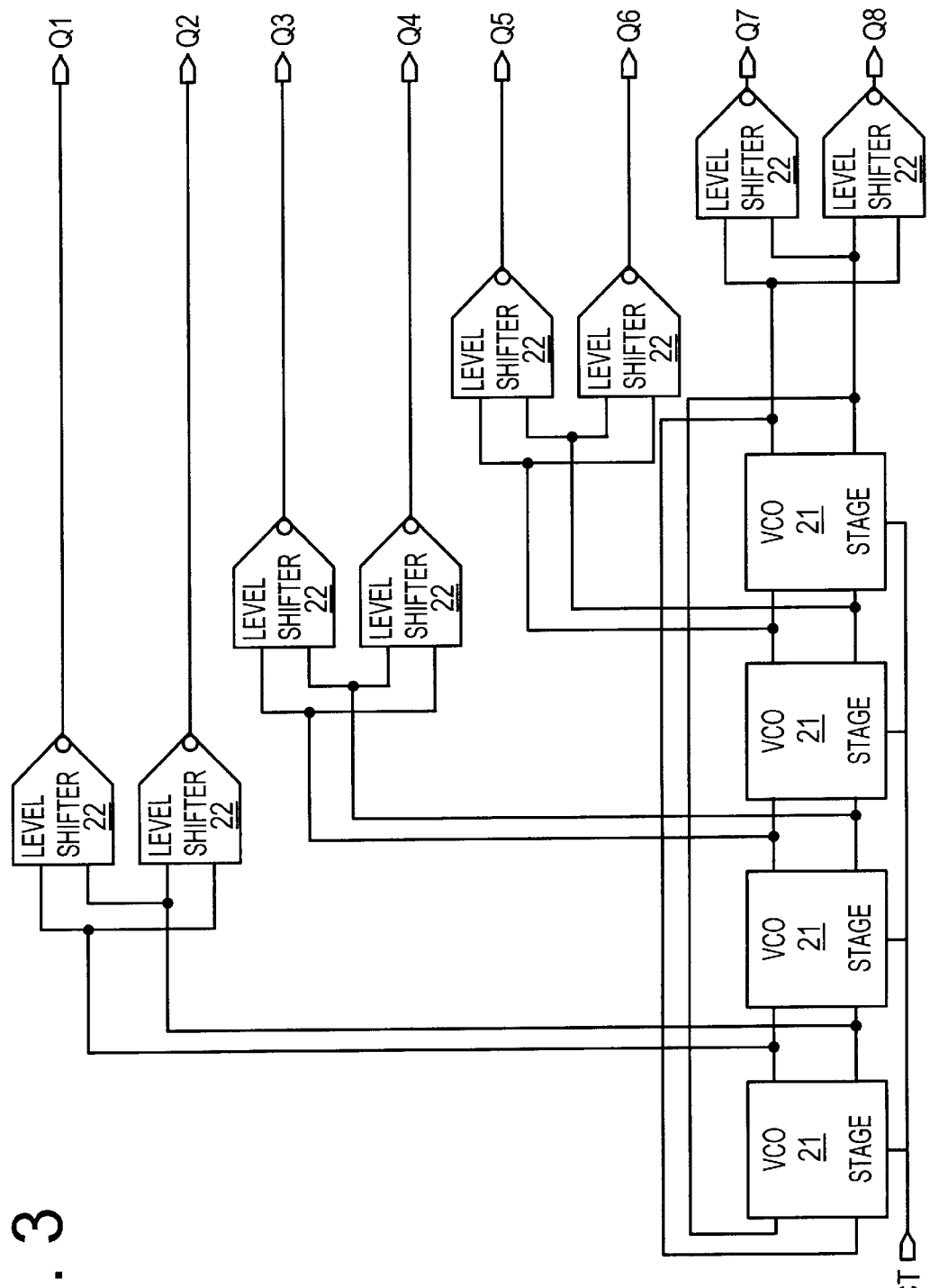
FIG. 3 is a circuit diagram showing the VCO of the PLL shown in FIG. 2.
Figure 4:
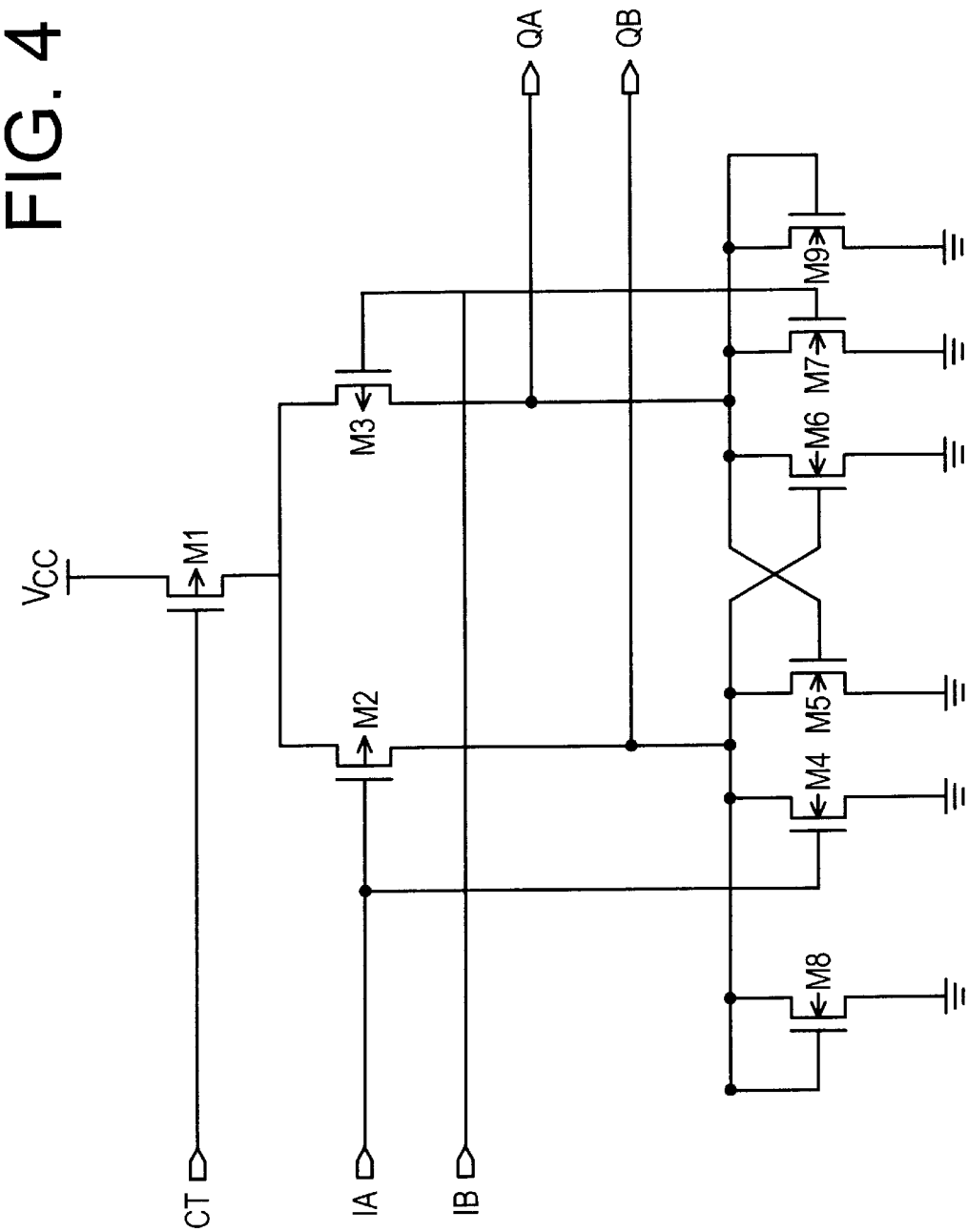
FIG. 4 is a circuit diagram showing the VCO stage of the VCO shown in FIG. 3.

As shown in FIG. 2, the PLL circuit comprises a Voltage Controlled Oscillator (VCO) 15, a phase and frequency detector 16, a charge pump 17, a current reference circuit 18, a frequency divider 19 and a loop filter 20.

The VCO 15 is formed as a differential 4-stage ring oscillator. Independent of the selected output clock frequency option, the VCO is always operated at 200 MHz. Eight multi-phase clock outputs, Q1–Q8 are provided by the VCO which differ by their relative phase. Due to the circuit symmetry, the eight clock outputs are equally phase spaced by 45 degrees which corresponds to time increments of 625 ps. These clocks are provided to the clock phase aligner who is selecting one of the eight clocks (or divided clock) for the strobing of the incoming data.

Each VCO stage 21 is implemented as a differential amplifier. The amplifier load is formed of the cross-coupled devices M5 and M6 and of the two devices M8 and M9 which are connected as diodes. The differential input is applied to the source coupled input pair M2 and M3 as well as to the two pull-down devices M4 and M7.

Figure 5:
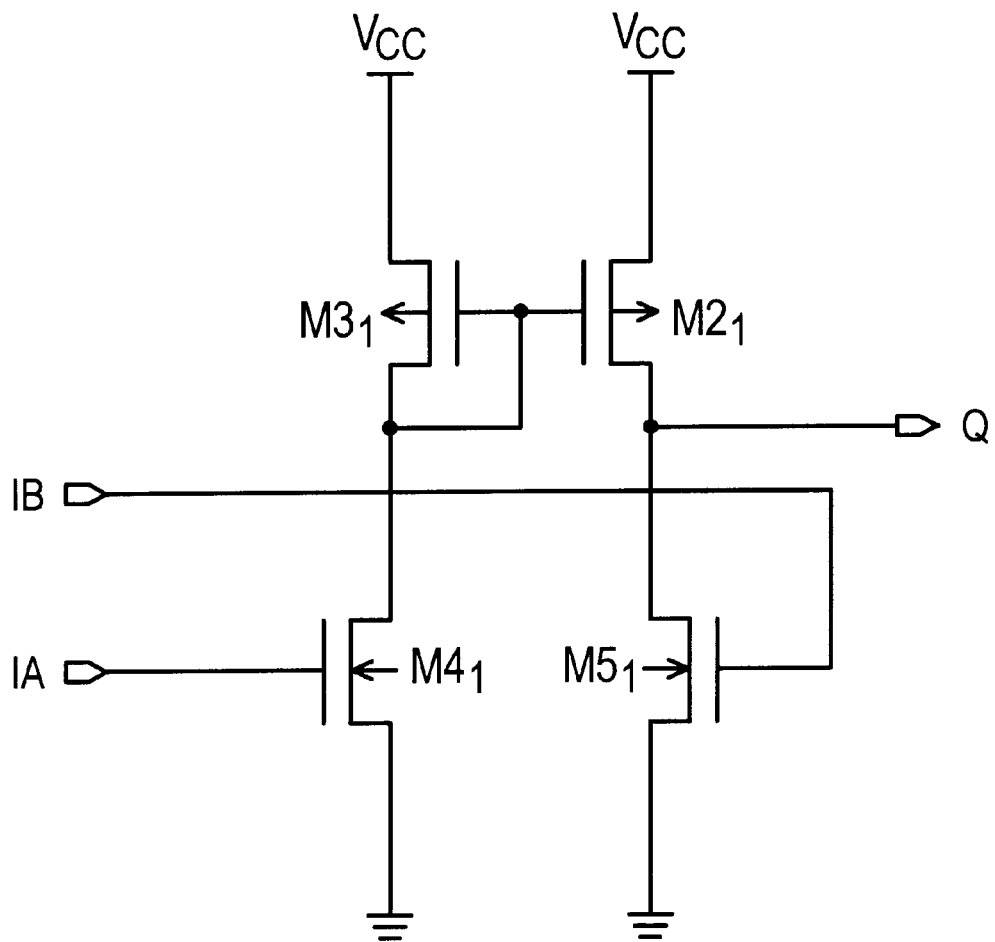
FIG. 5 is a circuit diagram showing the level shifter of the VCO stage shown in FIG. 4.

The differential oscillator signals are converted to the single ended clock outputs by the level shifter 22 (see FIG. 5). The differential inputs which are referred to ground are applied to the two NMOS devices $M4_1$ and $M5_1$. The two PMOS devices $M2_1$ and $M_3$, form a current mirror and provide pull-up to the output Q. Device M1 is providing a sourcing bias current as a function of the control voltage $V_{CT}$. When decreasing the gate voltage of device M1, the sourcing current increases which in turn increases the oscillation frequency.

A sequential phase and frequency detector 16 is used to compare the divided oscillator clock with the reference frequency. The concept of this phase detector is well known in the field. The phase detector provides the outputs UP and DO and their complements which are controlling the charge pump 17.

The frequency divider divides the oscillation frequency of 200 MHz by a fixed divisor of 10 to the reference frequency of 20 MHz. The divider further must operate correctly over the entire oscillator frequency range. This requirement is in particular of concern at the largest possible oscillation frequency since otherwise the PLL 10 could be stuck in a dead-lock mode. It is however not a requirement that the oscillator is prevented from stopping the oscillation at the lower frequency bound. At the lower frequency bound, the frequency divider may fail to operate provided that the divider is not proving excess clocks, e.g. by entering into a self-oscillation mode.

Figure 6:
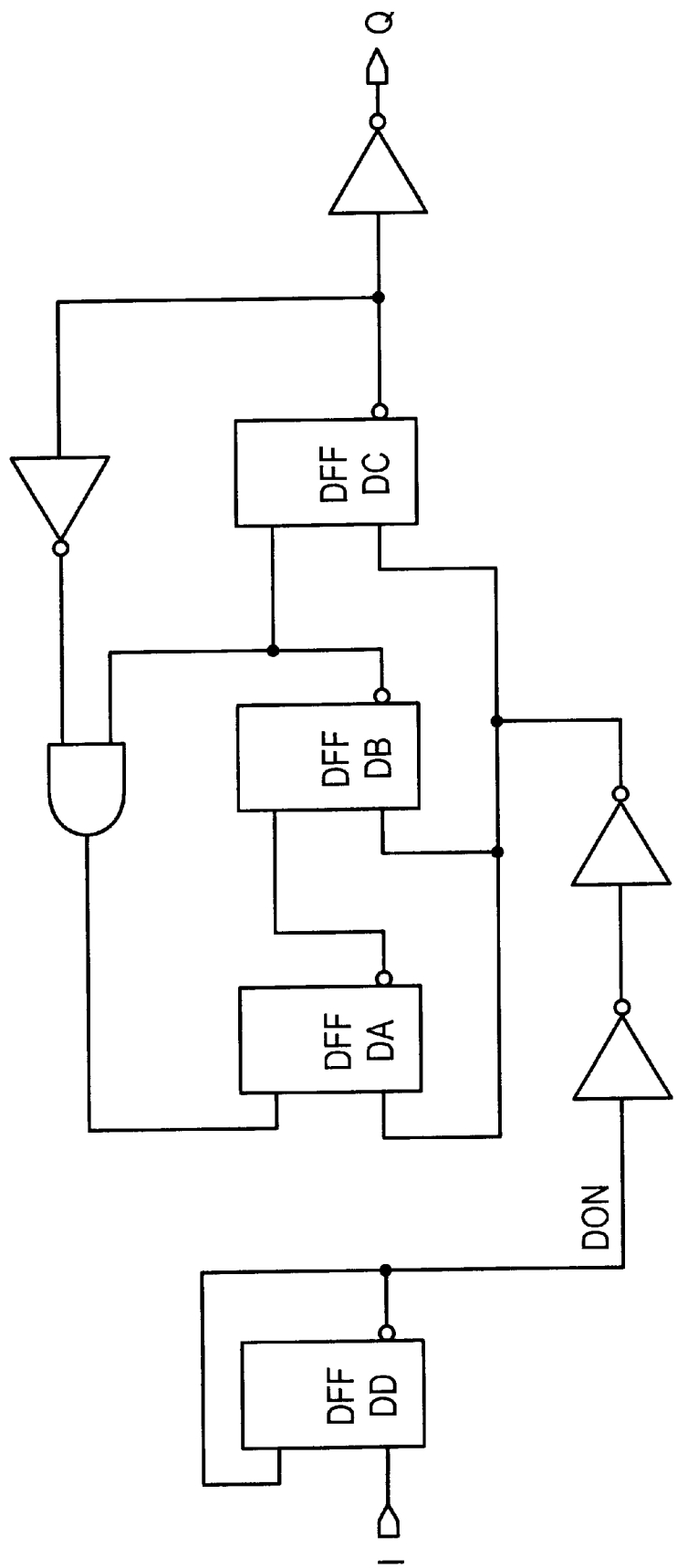
FIG. 6 is a circuit diagram showing the frequency divider of the PLL shown in FIG. 2.

The schematic of the frequency divider is given in FIG. 6, DFF DD is connected as a toggle and divides the clock frequency by two. The DFF's DA, DB and DC are in a synchronous counter configuration and are dividing its clock DDN by five. By circuit simulation, it has been verified that the divider works reliably at the upper frequency bound of the VCO 15.

The loop filter 20 determines the dynamic parameters of the PLL. At nominal conditions the natural frequency and the damping coefficient have been set to:

$f_N = f_{REF}/40 = 0.5$ MHz
$\zeta = 1.41$

Figure 7:
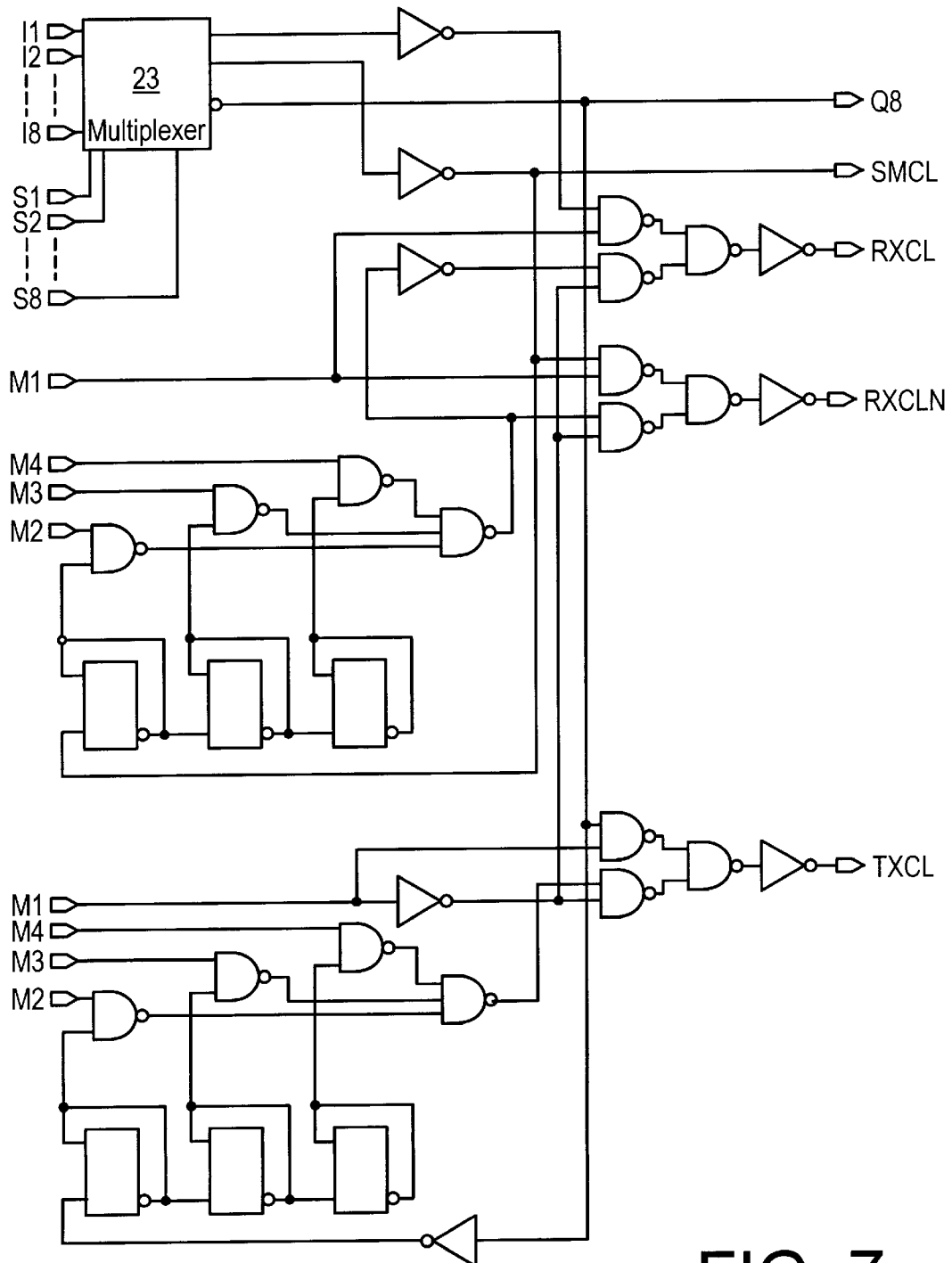
FIG. 7 is a circuit diagram showing the clock generator of the clock phase aligner block shown in FIG. 1.

The clock generator 11 of the clock phase aligner block is illustrated in FIG. 7 and provides separate clocks for the transmit direction (TXCL) and the receive direction (RXCL). The clock phase of the receive clock CLRX is under control of the asynchronous phase aligner logic which selects the appropriate clock phase of the oscillator by means of a multiplexer 23. Furthermore, this module contains two three-stage ripple counters in order to provide the internal clock frequency which is either 200 MHz, or 100 MHz, or 50 MHz, or 25 MHz, according to the selected option. A further frequency divider by two is required to generate the transmit clock of the second circuit which has been set to one half of the baud rate.

The clock multiplexer select inputs S(1:8) are 1/n coded; to select a clock phase the corresponding select input has to be set HIGH while all other select inputs have to be set LOW. It is assumed that the clock selector is either incremented or decremented in steps of one. In order to prevent clocks from being truncated in its duration, or to avoid clock glitches, it is required that the select inputs must change while the selected clock phase as well as its adjacent clocks are LOW.

The true clock output and its complement are formed by two separate multiplexers with the benefit that the corresponding clock edges remain exactly timed, independent of pulse distortion. Further it is suggested to use symmetrical NAND gates which provide equal propagation delay to each input. A custom layout of the multiplexer module 23 is required in order to equalise the interconnection capacitance.

The buffered output is controlling the frequency divider by IO circuit which is part of the PLL. The selected clock phase is provided by output Q. The output Q8 of the clock multiplexer 23 controls a 3-stage ripple counter of the transmit clock and further returns to the PLL in order to clock the frequency divide by IO circuit. Gates are under control of the mode inputs and selects the appropriate clock frequency.

The receive clock is generated by means of a dedicated ripple counter and its associated mode select gates. This module is clocked by the multiplexed clock output Q of the clock multiplexer 23. Thus, its phase can be adjusted in increments of 625 ps by means of the select inputs S(1:8). Hence, the relative phase increments are dependent on the selected frequency mode; they reach a maximum of 45 deg. for $f_{Clock\_int}=200$ MHz which reduces to 5.6 deg. for the minimum clock frequency of $f_{Clock\_int}=25$ MHz.

The invention is not limited to the above described embodiments, instead several modifications may be made within the scope of the invention.

What is claimed is:

1. A voltage controlled oscillator (VCO) for use in a phase locked loop for clock multiplication, which can be used to recover data pulses from a data input stream comprising digital data with an unknown phase, comprising:
    a plurality of VCO stages, each of said stages being implemented as a differential amplifier;
    the amplifier load being formed of two cross-coupled gate devices and two gate devices which are connected as diodes, wherein a differential input is applied to a source coupled pair of gate devices as well as to two pull-down gate devices.

2. The voltage controlled oscillator of claim 1, wherein a gate device is arranged to provide a sourcing bias current as a function of a control voltage.

3. The voltage controlled oscillator of claim 2, wherein a decreased gate voltage, of the gate device arranged to provide the sourcing bias current, increases the sourcing current which in turn increases the oscillation frequency.

4. The voltage controlled oscillator of claim 1, wherein each VCO stage is provided with two level shifters for converting differential oscillator signals to single ended clock outputs, and wherein the differential inputs which are referred to ground are applied to two NMOS devices.

5. The voltage controlled oscillator of claim 4, wherein each level shifter is provided with two PMOS devices forming a current mirror and providing pull-up to an output.

6. The voltage controlled oscillator of claim 1, wherein said VCO is included in a clock phase aligner for a digital data communication system, comprising a phase locked loop circuit with a phase and frequency detector data transition phase detector which interacts with a state machine for processing of data.

* * * * *